United States Patent [19]

Elliott

[11] Patent Number: 5,162,082
[45] Date of Patent: Nov. 10, 1992

[54] ELECTROCHEMICAL REDUCTION TREATMENT FOR SOLDERING

[75] Inventor: Donald A. Elliott, Brossard, Canada
[73] Assignee: Electrovert Ltd., LaPrairie, Canada
[21] Appl. No.: 808,408
[22] Filed: Dec. 16, 1991
[51] Int. Cl.⁵ .......................... C25F 1/00; C25F 7/00
[52] U.S. Cl. .................................. 204/140; 204/224 R
[58] Field of Search ........................... 204/140, 224 R

[56] References Cited

PUBLICATIONS

D. M. Tench et al., *Electrochemical Assessment of Sn-Pb Solderability*, Aug. 1990, pp. 44-46.
H. Akahoshi et al., *New Copper Surface Treatment for Polyimide Multilayer Printed Wiring Boards*, 1987.
E. Lenz, *Automatisiertes Loten elektronischer Baugruppen*, Nov. 1985.

*Primary Examiner*—T. M. Tufariello
*Attorney, Agent, or Firm*—Darby & Darby

[57] ABSTRACT

The application of electrochemical reduction treatment liquids and electroless reduction treatment liquids to elements such as circuit boards for cleaning metallic surfaces in preparation for soldering is accomplished using a wave of the treatment liquid over a liquid tank. A wave treatment has advantages over spraying, which causes too much atomizing, and dipping, which is slow and requires complicated conveyors that are multi-directional. The method comprises forming a wave of reduction treatment liquid in an inert atmosphere and passing components through the wave so the reduction treatment liquid contacts the surfaces to be solder coated.

22 Claims, 2 Drawing Sheets

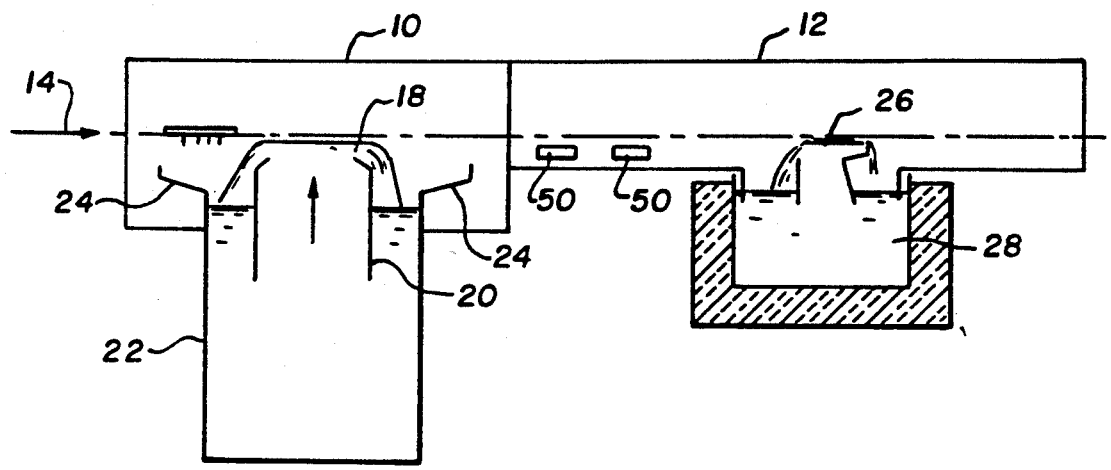
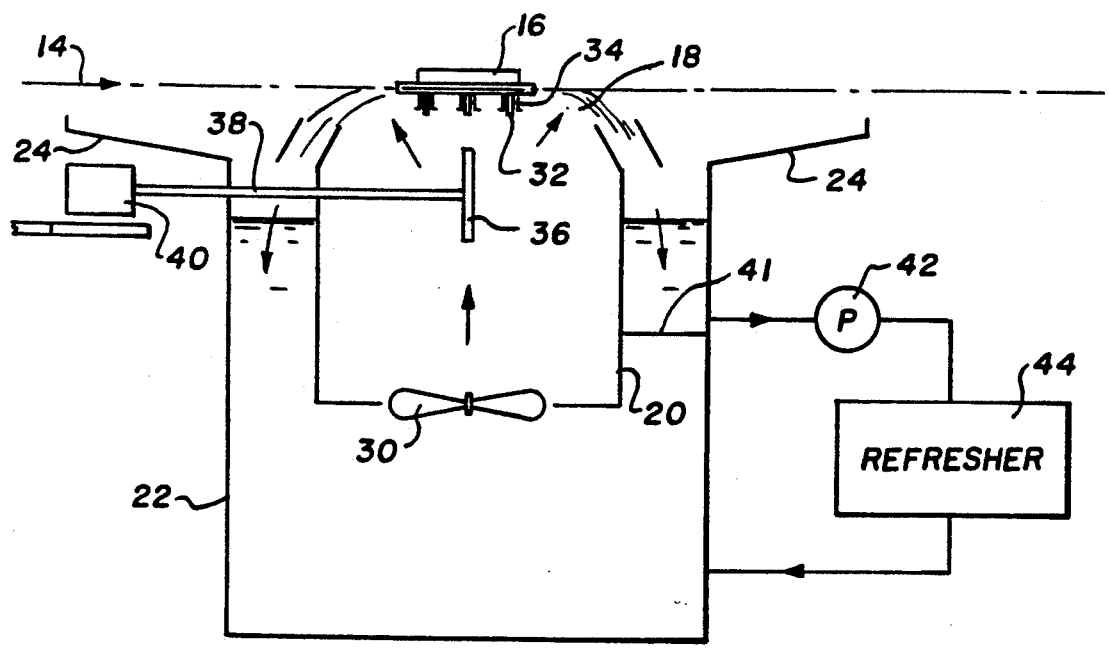

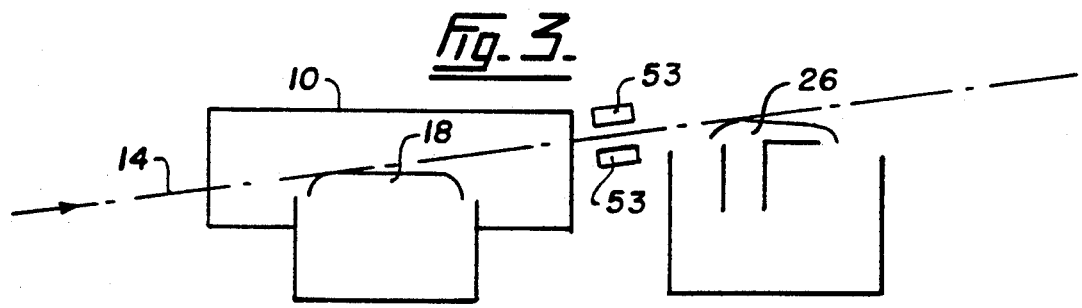
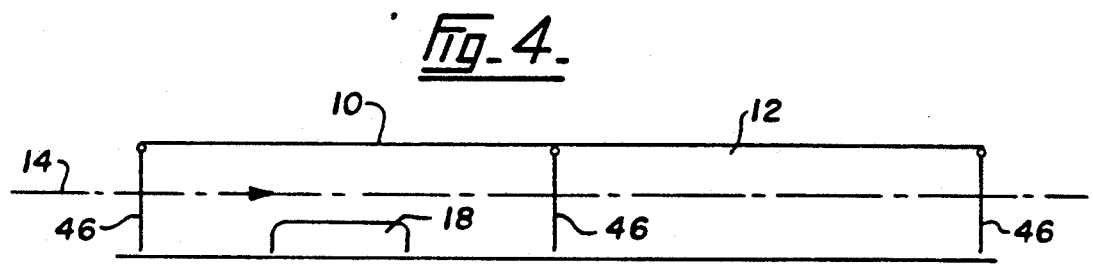
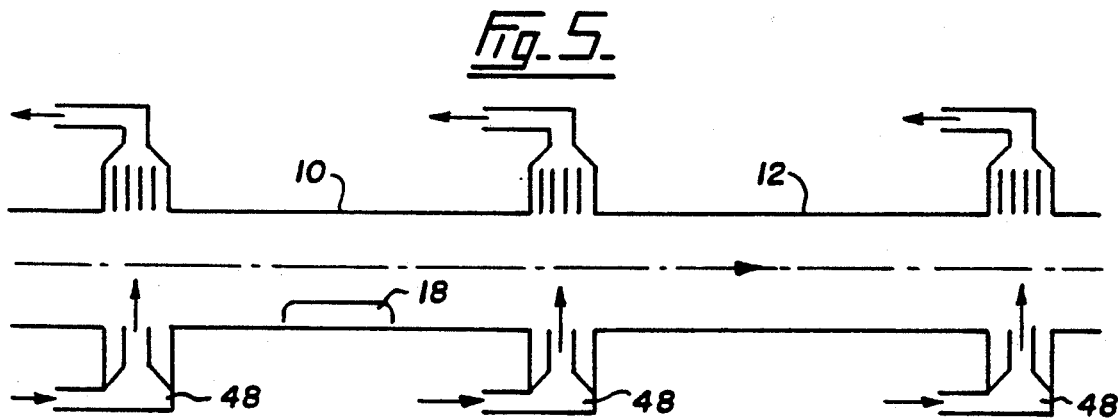
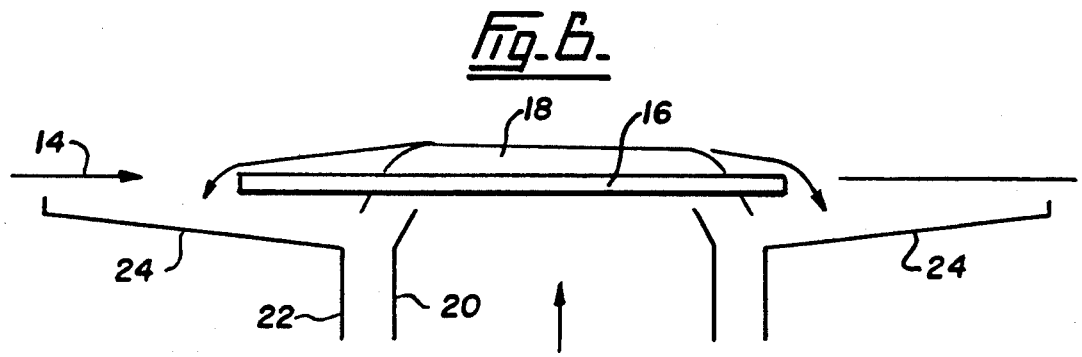

ELECTROCHEMICAL REDUCTION TREATMENT FOR SOLDERING

TECHNICAL FIELD

The present invention relates to a method and apparatus for soldering using electrochemical or electroless reduction. More specifically the present invention relates to utilizing a reduction treatment liquid applied to surfaces to be soldered in order to remove by reduction the oxides formed on contaminated metallic surfaces to be solder coated or solder joined.

BACKGROUND ART

When applying a coating of solder to surfaces to be soldered, it is necessary to remove oxides, otherwise wetting of the surface by solder may not occur. The term "wetting" refers to solder bonding to metal surfaces. If solder does not bond to metal surfaces then wetting has not occurred. This is unacceptable, particularly on component leads to be solder coated and on printed wiring boards having components to be soldered thereon. In many cases, the components have pins that extend through holes and it is necessary to ensure that the solder "wicks" up through the holes and wets both the exterior surfaces of the pins and the inside surfaces of the holes to ensure a proper soldered contact.

In the past one applied flux to the surfaces to be soldered and whereas flux dissolves the oxides that are present on the surface, flux and oxide residues may be formed in the process, and in the case of solder dipping or wave soldering, these residues can collect on the components or in the solder reservoir which can be harmful to the solder process, to the reliability of the electronic components or circuit assemblies, and in some cases to the environment.

It has been found that if soldering occurs on good solderable surfaces within an inert atmosphere and on occasions with a small quantity of hot reducing gas such as hydrogen, that flux is not needed. Good wetting occurs and reliable soldering can result. However, oxide deposits that have built up on metal surfaces require to be removed prior to soldering to ensure proper solder wetting.

In a paper published in June, 1987, entitled "New Copper Surface Treatment for Polyimide Multilayer Printed Wiring Boards" by Haruo Akahoshi and Yoshihiro Suzuki, is disclosed a reduction treatment for a surface oxide layer to give a metallic copper surface with no changes in its morphology. This conversion was shown to occur by means of wet chemical or electrochemical reduction. Varying the current density in the electrochemical reaction changed the surface structure. It was reported that a higher current density retained the original surface structure while low current density changed the original surface structure. The authors reported that if the original surface structure is retained, the adhesion characteristics are identical to those of the untreated surfaces.

Electrochemical reduction for copper and tin-lead surfaces is disclosed in an article by Tench and Anderson entitled "Electrochemical Assessment of Sn-Pb Solderability" published August, 1990, in Plating and Surface Finishing. The electrochemical reduction was performed in a sodium borate solution under an inert gas utilizing a Pt counter electrode and a reference saturated calomel electrode (SCE).

Reduction of the oxides on metallic surfaces for improvements in multilayer board adhesion using electrochemical reduction is disclosed in the above article. Unlike chemical treatment which uses a flux to dissolve oxides, electrochemical reduction treatment does not dissolve the oxides but treats the surfaces electrochemically. The elements having metallic oxides on the surfaces to be electrochemically treated have the liquid applied to these surfaces, usually in a dip tank somewhat similar to an electroplating bath. The liquid reduces the oxides wherein the treated metal surfaces are cleaned of oxides. There are substantially no residues remaining on the treated metallic surfaces by this reduction process as compared to the application of fluxes.

Electrochemical reduction, sometimes known as reverse plating has conventionally been a batch type operation such as dipping in a tank containing treatment liquid. Spraying, while used for wet chemical spraying, generally is not appropriate with wet batch processing as applied in board fabrication shops. Spraying cannot be used for electrochemical reduction as current will not flow in a spray, unless a continuous flood is used. Continuous dipping requires a conveyor which travels down into a tank and then up out of the tank. Such a non-in-line conveyor becomes complex. Thus there is a requirement to flood components such as circuit boards and the like which is simple and does not cause atomization of the treatment liquid.

It is an aim of the present invention to provide a novel method and apparatus for generously flooding an electrochemical liquid, or in some cases an electroless liquid, onto metallic surfaces of an element to be treated for soldering to remove oxides by reduction rather than by fluxing, without dipping or spraying.

DISCLOSURE OF INVENTION

The present invention provides in a method of treating metallic surfaces of components to be solder coated or joined, including the steps of applying a reduction treatment liquid to reduce oxides on the surfaces of the components within an inert atmosphere prior to solder coating or joining, the improvement comprising the steps of forming a wave of reduction treatment liquid in the inert atmosphere, and passing the components through the wave so the reduction treatment liquid contacts the surfaces to be solder coated or joined.

In a further embodiment there is provided an apparatus for applying electrochemical reduction treatment liquid or an electroless reduction treatment liquid to metallic surfaces of components to be solder coated or joined, comprising a nozzle adapted to form a wave of the reduction treatment liquid, a pump means for pumping the reduction treatment liquid to form the wave, conveying means for conveying components through the wave so the surfaces to be solder coated or joined are contacted by the reduction treatment liquid, and inerting means to provide an inert atmosphere to exclude oxygen in the region of the nozzle.

BRIEF DESCRIPTION OF DRAWINGS

In drawings which illustrate embodiments of the present invention:

FIG. 1 is a schematic elevational view showing a reduction treatment liquid wave in a first chamber, followed by a solder wave in a second chamber;

FIG. 2 is a schematic elevational view showing a treatment liquid wave arrangement according to one embodiment of the present invention;

FIG. 3 is a schematic elevational view showing a treatment liquid wave in a chamber followed by wave soldering;

FIG. 4 is a schematic elevational view showing a reduction treatment liquid wave in a first chamber, followed by a second chamber where solder coating occurs;

FIG. 5 is a schematic elevational view similar to that shown in FIG. 4 having gas curtains between a treatment chamber and a soldering chamber;

FIG. 6 is a schematic elevational view showing drip trays on each side of a tank with a treatment liquid wave arrangement therein.

BEST MODES FOR CARRYING OUT THE INVENTION

FIG. 1 shows schematically a reduction treatment chamber 10 followed by a soldering chamber 12. A conveyor 14 transports components 16 first into the treatment chamber 10 and then into the soldering chamber 12. The treatment chamber 10 is inerted either by the addition of nitrogen or other inert gas to prevent further oxidizing occurring on the metal surfaces to be treated for solder coating or joining. A component 16 enters the treatment chamber 10 through a flap, a gate, door, gas curtain, or other opening that tends not to permit air to enter. In one embodiment, for instance, a positive pressure of inert gas is attained within the treatment chamber 10 thus ensuring that whereas some escapes through the entrance and exit, there is always an inert gas atmosphere within the chamber 10. It is preferred to exclude oxygen in the treatment chamber 10 to a level of 5 to 5000 ppm of residual oxygen.

A component 16 passes through a reduction treatment liquid wave 18 which extends up from a nozzle 20 and drops back into a reservoir 22 having drip trays 24 on both sides. The treatment liquid wave 18 either contacts only the bottom surface of the component 16 or, alternatively, floods over the top surface as well as the bottom surface of the component 16. This can be varied depending on the requirements for components to be soldered. For instance, if soldering is to occur on both the top surface and the bottom surface, then it may in some cases be necessary to provide the electrochemical reduction treatment liquid or electroless reduction treatment liquid to both surfaces of the components.

After passing through the treatment liquid wave 18, the component 16 passes from the reduction treatment chamber 10 into the soldering chamber 12, through a solder wave 26 from a solder reservoir 28 and exits from the soldering chamber 12. In one embodiment oxygen is excluded in the soldering chamber 12 as in the treatment chamber 10. The exclusion of oxygen may be more, less or the same in the soldering chamber 12 as in the treatment chamber 10 depending upon the requirements of different components 16 being treated. Whereas the soldering chamber 12 is shown adjacent to and in the same conveyor line 14 as the reduction treatment chamber 10, it will be apparent that in certain circumstances the reduction treatment chamber 10 may be a batch type chamber wherein components are passed in through a doorway, a door or flap closed, treated in the liquid wave 18, and then removed after treatment through the doorway. The treated components may then be kept for at least 24 to 48 hours prior to being soldered. This time period may be limited or reduced as required by deterioration of the treated surfaces to be soldered due at least partly to the environment and atmospheric conditions in the location where the components are stored. The time period may also be reduced to meet production requirements.

A reduction treatment tank 22 is illustrated in FIG. 2 wherein a pump 30 is shown pumping electrochemical or electroless reduction treatment liquid through the nozzle 20 to form the reduction treatment wave 18. The component 16 in the form of a board has a series of pins 32 in holes 34 and the reduction treatment liquid wicks up between the pins 32 and the holes 34 to ensure that metal oxides on the surfaces within the holes 34 and the pins 32 are treated so that complete solder wetting can occur. The treatment liquid also treats the pads on the top side of a board where applicable. In one embodiment, a vibrator vane 36 is positioned in the nozzle 20 having an attachment arm 38 to a vibrator 40. The vibration range is below ultrasonic frequencies, and preferably in the range of about 20 to 400 Hz. The vibrator 40 oscillates the vane 36 and in some cases it is found that such a vibration in the wave 18 provides better wicking up of the reduction treatment liquid into the space between the pins 32 and the holes 34 of the component 16 and out onto the pads on the top sides of the boards.

FIG. 1 illustrates the conveyor 14 conveying components 16 in a substantially horizontal path through the treatment chamber 10 followed by the soldering chamber 12. In other embodiments the path may slope upwards, or may be horizontal in the treatment chamber 10 and slope upwards in the soldering chamber 12.

As shown in FIG. 2 a deflector plate 41 is positioned between the side of the nozzle 20 and the tank 22, and a circulating pipe above the plate 41 circulates the reduction treatment liquid through a pump 42 which passes it through a refresher 44 to remove metal, oxides, and any other deposits which have been removed by the treatment liquid from the boards, and returns a clean reduction treatment liquid to the tank 22 so that the pump 30 pumps refreshed reduction treatment liquid to the wave 18.

In one embodiment as shown in FIG. 1, the soldering chamber 12 is enclosed and has an inert atmosphere therein so that the soldering occurs within an inert atmosphere. Seals may be provided at entry and exit to the soldering chamber 12. FIG. 3 illustrates another embodiment wherein the reduction treatment occurs in a reduction treatment chamber 10 having an inert atmosphere therein, followed by soldering in a solder wave 26 which is not enclosed in a chamber. In this embodiment, the conveyor line 14 slopes upwards to assist in draining liquid off the components. FIG. 4 illustrates a reduction treatment chamber 10 and the soldering chamber 12 side-by-side with flaps 46 at the entrance and exit to each chamber 10, 12. The soldering may be inert reflow soldering or other known types of soldering such as infrared, vapour phase, laser, ultrasonic. A preheating zone may be utilized within the soldering chamber with heaters 50 positioned below the conveyor line 14 as shown in FIG. 1. FIG. 3 illustrates heaters 53 positioned above and below the conveyor line 14 before the solder wave. As stated the soldering chamber may be filled with an inert gas such as nitrogen.

FIG. 5 illustrates a further embodiment wherein gas curtains 48 are shown before the reduction treatment chamber 10, between the reduction treatment chamber 10 and the soldering chamber 12, and after the soldering chamber 12. The reduction treatment chamber 10 in one embodiment includes a blow-off stage after the components pass through the reduction treatment liquid wave 18 to remove liquid from the surfaces on the component 16. In the embodiment shown the gas curtain 48 at the exit of the reduction treatment chamber 10 assists in blowing off any liquid that remains on the components. In another embodiment a jet or jets of inert gas may be directed at the top as well as the bottom surfaces of the components 16.

FIG. 6 illustrates a large component 16 which extends beyond the length of the reduction treatment liquid wave 18. As illustrated here the wave 18 applies the reduction treatment liquid to the top and bottom surfaces of the component 16 thus the liquid falls off the component 16 on both ends and large drip trays 24 are provided to ensure that the liquid returns to the tank 22.

FIG. 1 shows a solder wave 26 in a soldering chamber 12, and FIG. 3 shows a solder wave 26 not in a soldering chamber. FIG. 4 shows a soldering chamber. The solder coating or joining can be applied by known soldering devices and methods which include different types of solder wave or multiple solder waves, vapour phase soldering, reflow soldering and other devices and methods available for solder coating and joining.

Various changes may be made to the embodiments shown and described herein without departing from the scope of the present invention which is limited only by the following claims.

The embodiments of the present invention in which an exclusive property or privilege is claimed are defined as follows:

1. In a method of treating metallic surfaces of components to be solder coated or joined, including the steps of applying a reduction treatment liquid to reduce oxides on the surfaces of the components within an inert atmosphere prior to solder coating or joining, the improvement comprising the steps of:
   forming a wave of reduction treatment liquid in the inert atmosphere, and
   passing the components through the wave so the reduction treatment liquid contacts the surfaces to be solder coated or joined.

2. The method of treating components according to claim 1 wherein the inert atmosphere is within a chamber.

3. The method of treating components according to claim 2 wherein the chamber is a closed chamber having closure means at least at one access for insertion of components.

4. The method of treating components according to claim 2 including a conveyor to transport components through the chamber and including a closure means at an entry and an exit to maintain an inert atmosphere within the chamber.

5. The method of treating components according to claim 4 including inert gas curtains at entrance and exit, the exit curtains adapted to blow off reduction treatment liquid remaining on the components.

6. The method of treating components according to claim 1 wherein the wave of reduction treatment liquid is formed by pump means pumping the liquid up through a nozzle and including a means to refresh the liquid before being formed into the wave.

7. The method of treating components according to claim 1 including a vibrator to vibrate reduction treatment liquid in the wave, the vibrator adapted to oscillate a vane in the wave in the range of about 20 to 400 Hz.

8. The method of treating components according to claim 1 wherein the reduction treatment liquid is an electrochemical reduction treatment liquid or an electroless reduction treatment liquid that reduces oxides on metal surfaces.

9. The method of treating components according to claim 1 wherein any remaining reduction treatment liquid on the components is removed by blowing after treating.

10. The method of treating components according to claim 4 wherein the conveyor is inclined to slope upwards in a direction of travel.

11. The method of treating components according to claim 4 wherein the conveyor is substantially horizontal.

12. The method of treating components according to claim 1 including the additional step of solder coating or solder joining the metallic surfaces of the components after being treated.

13. An apparatus for applying an electrochemical reduction treatment liquid or an electroless reduction treatment liquid to metallic surfaces of components to be solder coated or joined comprising:
    a nozzle adapted to form a wave of the reduction treatment liquid;
    a pump means for pumping the reduction treatment liquid to form the wave;
    conveying means for conveying components through the wave so the surfaces to be solder coated or joined are contacted by the reduction treatment liquid, and
    inerting means to provide an inert atmosphere to exclude oxygen in the region of the nozzle.

14. The apparatus for applying a reduction treatment liquid according to claim 13 wherein the nozzle is in a chamber having closure means at an entry and exit.

15. The apparatus for applying a reduction treatment liquid according to claim 13 wherein a vibrator oscillates a vane in the wave of reduction treatment liquid in the range of about 20 to 400 Hz.

16. The apparatus for applying a reduction treatment liquid according to claim 13 including a refresher means for refreshing the reduction treatment liquid prior to pumping the liquid to form the wave.

17. The apparatus for applying a reduction treatment liquid according to claim 14 wherein the closure means comprise gas curtains.

18. The apparatus for applying a reduction treatment liquid according to claim 14 including drying means to blow off reduction treatment liquid remaining on the surfaces of the component after passing through the wave.

19. The apparatus for applying a reduction treatment liquid according to claim 13 including drip trays on each side of the nozzle to ensure reduction treatment liquid flowing over top surfaces of the component fall back into a tank from which the wave of reduction treatment liquid is pumped.

20. The apparatus for applying a reduction treatment liquid according to claim 13 wherein the conveyor means is inclined to slope upwards in a direction of travel.

21. The apparatus for applying a reduction treatment liquid according to claim 13 wherein the conveyor means is substantially horizontal.

22. The apparatus for applying a reduction treatment liquid according to claim 13 including coldering means provided to solder coat or solder join the metallic surfaces of the components after being treated.

* * * * *